United States Patent
Nandakumar et al.

(10) Patent No.: US 9,269,636 B2
(45) Date of Patent: Feb. 23, 2016

(54) HIGH QUALITY DIELECTRIC FOR HI-K LAST REPLACEMENT GATE TRANSISTORS

(71) Applicant: Texas Instruments Incorporated, Dallas, TX (US)

(72) Inventors: Mahalingam Nandakumar, Richardson, TX (US); Hiroaki Niimi, Cohoes, NY (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 35 days.

(21) Appl. No.: 14/575,490

(22) Filed: Dec. 18, 2014

(65) Prior Publication Data
US 2015/0187659 A1 Jul. 2, 2015

Related U.S. Application Data

(60) Provisional application No. 61/922,472, filed on Dec. 31, 2013.

(51) Int. Cl.
| | |
|---|---|
| H01L 21/8234 | (2006.01) |
| H01L 21/8238 | (2006.01) |
| H01L 29/66 | (2006.01) |
| H01L 21/28 | (2006.01) |
| H01L 27/092 | (2006.01) |

(52) U.S. Cl.
CPC .. *H01L 21/823857* (2013.01); *H01L 21/28079* (2013.01); *H01L 21/28088* (2013.01); *H01L 21/28202* (2013.01); *H01L 21/28238* (2013.01); *H01L 21/82345* (2013.01); *H01L 21/82385* (2013.01); *H01L 21/823462* (2013.01); *H01L 21/823842* (2013.01); *H01L 27/0922* (2013.01); *H01L 29/66545* (2013.01)

(58) Field of Classification Search
CPC ......... H01L 21/82345; H01L 21/823462; H01L 21/823828; H01L 21/823842; H01L 21/823857; H01L 21/28202; H01L 27/0922; H01L 21/28238; H01L 29/66545
See application file for complete search history.

(56) References Cited

U.S. PATENT DOCUMENTS

| | | | | |
|---|---|---|---|---|
| 6,660,597 B2 * | 12/2003 | Furukawa et al. | ............ | 438/287 |
| 2012/0225545 A1 * | 9/2012 | Fu et al. | ........................ | 438/585 |

* cited by examiner

*Primary Examiner* — Bac Au
*Assistant Examiner* — Toniae Thomas
(74) *Attorney, Agent, or Firm* — Jacqueline J. Garner; Frank D. Cimino

(57) ABSTRACT

A replacement metal gate transistor is formed with high quality gate dielectric under the high-k dielectric. The high quality gate dielectric is formed on the substrate at a temperature of at least 850° C. A sacrificial gate dielectric is formed on the high quality gate dielectric and a polysilicon replacement gate is formed on the sacrificial gate dielectric. The polysilicon replacement gate is removed leaving a gate trench. The sacrificial gate dielectric is removed from a bottom of the gate. A high-k dielectric is deposited into the gate trench. Metal gate material is deposited on the high-k dielectric.

10 Claims, 12 Drawing Sheets

HIGH QUALITY DIELECTRIC FOR HI-K LAST REPLACEMENT GATE TRANSISTORS

CROSS-REFERENCE TO RELATED APPLICATIONS

This application claims the benefit of priority under U.S.C. §119(e) of U.S. Provisional Application 61/922,472, filed Dec. 31, 2013), the contents of which are incorporated herein by reference.

FIELD OF INVENTION

This invention relates to the field of integrated circuits. More particularly, this invention relates to replacement gate transistors in integrated circuits.

BACKGROUND

As the geometries for integrated circuits have scaled to smaller and smaller dimensions, it has become necessary to replace polysilicon transistor gates with metal gates to enable scaling to continue to smaller dimensions. When voltage is applied to a polysilicon gate, the polysilicon grains next to the gate dielectric become depleted of carriers increasing the electrical thickness of the gate dielectric and exacerbating short channel effects. Metal gates do not deplete when voltage is applied to the metal gate.

Because the work function of most metal gates changes when the metal gate is subjected to high temperatures such as is required to activate dopants, replacement metal gate processes have been developed to circumvent the work function problem. In a replacement gate process, transistors are first built in the usual manner using polysilicon gates and silicon dioxide gate dielectric. The polysilion gates and gate dielectric are then removed and replaced with high-k gate dielectric and metal gates. Typically a thin silicon dioxide dielectric is grown on the single crystal silicon transistor channel prior to deposition of the high-k gate dielectric. Because silicide is typically on the wafer when the thin silicon dioxide is grown, the temperature at which this thin silicon dioxide may be grown is limited. The quality the thin silicon dioxide gate dielectric formed at low temperatures during the replacement gate process may be marginal.

SUMMARY

The following presents a simplified summary in order to provide a basic understanding of one or more aspects of the invention. This summary is not an extensive overview of the invention, and is neither intended to identify key or critical elements of the invention, nor to delineate the scope thereof. Rather, the primary purpose of the summary is to present some concepts of the invention in a simplified form as a prelude to a more detailed description that is presented later.

A replacement metal gate transistor is formed with high quality gate dielectric under the high-k dielectric. The high quality gate dielectric is formed on the substrate at a temperature of at least 850° C. A sacrificial gate dielectric is formed on the high quality gate dielectric and a polysilicon replacement gate is formed on the sacrificial gate dielectric. The polysilicon replacement gate is removed leaving a gate trench. The sacrificial gate dielectric is removed from a bottom of the gate. A high-k dielectric is deposited into the gate trench. Metal gate material is deposited on the high-k dielectric.

DETAILED DESCRIPTION OF EXAMPLE EMBODIMENTS

The present invention is described with reference to the attached figures. The figures are not drawn to scale and they are provided merely to illustrate the invention. Several aspects of the invention are described below with reference to example applications for illustration. It should be understood that numerous specific details, relationships, and methods are set forth to provide an understanding of the invention. One skilled in the relevant art, however, will readily recognize that the invention can be practiced without one or more of the specific details or with other methods. In other instances, well-known structures or operations are not shown in detail to avoid obscuring the invention. The present invention is not limited by the illustrated ordering of acts or events, as some acts may occur in different orders and/or concurrently with other acts or events. Furthermore, not all illustrated acts or events are required to implement a methodology in accordance with the present invention.

Figure 1:
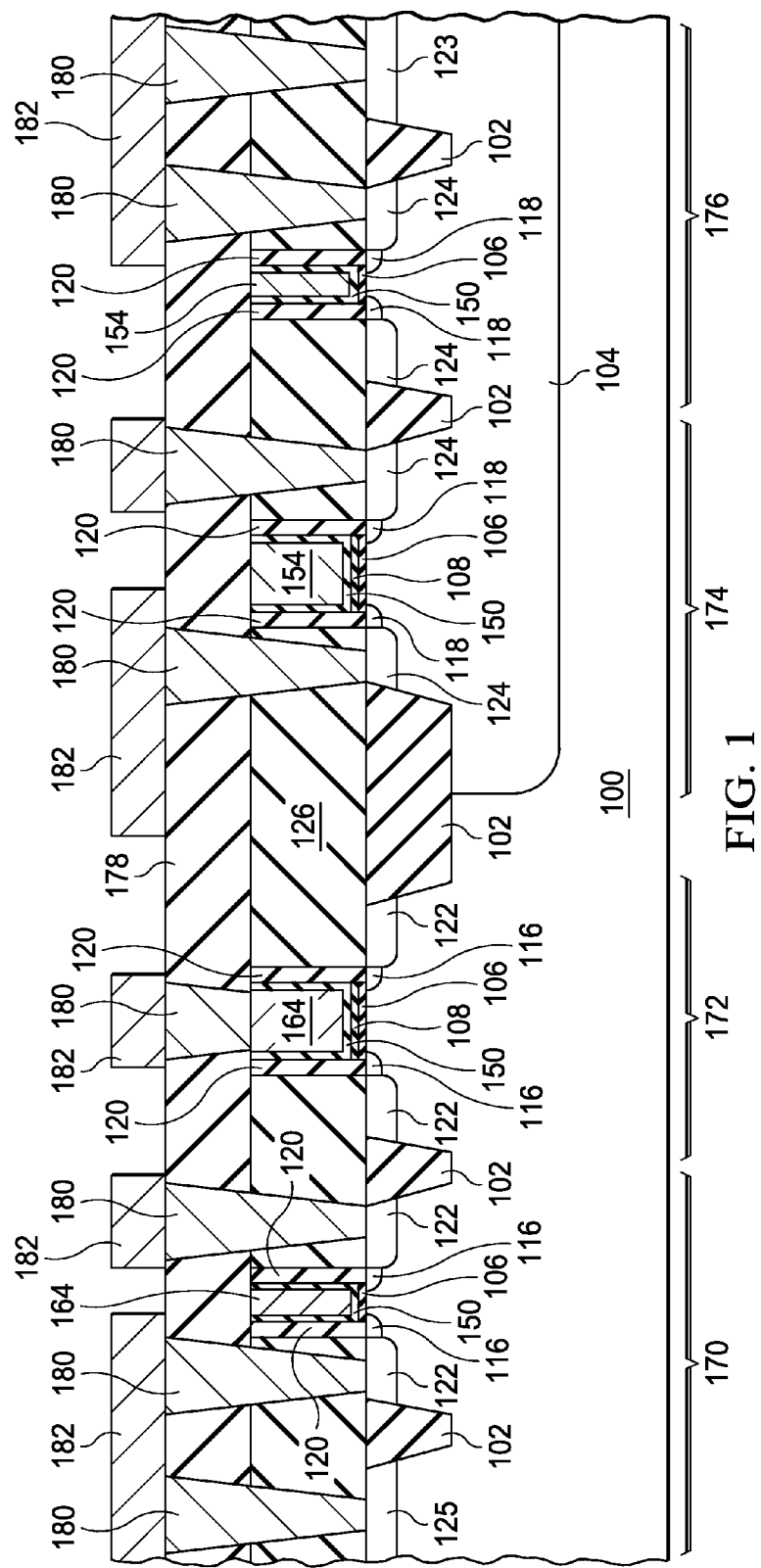
FIG. 1 is a cross section of an integrated circuit with a transistor with embodiment high quality dielectric formed according to principles of the invention.

An integrated circuit formed using embodiments of the invention with high quality interfacial dielectric is shown in FIG. 1. The low voltage complementary metal-oxide-semiconductor (CMOS) transistors 170 and 176 have an embodiment high quality interfacial dielectric 106. The embodiments are illustrated using a CMOS process flow that builds both low voltage n-channel metal-oxide-semiconductor (NMOS) 170 transistors and p-channel metal-oxide-semiconductor (PMOS) 176 and high voltage NMOS 172 (HVNMOS) and high voltage PMOS 174 (HVPMOS) transistors.

The NMOS transistors, 170 and 172, are built in p-type substrate 100. The PMOS transistors, 174 and 176, are built in nwell 104 in the p-type substrate 100. Shallow trench isolation (STI) dielectric structures 102 electrically isolate the transistors. The low voltage NMOS transistor 170 has high-k dielectric 150 deposited on the embodiment high quality gate dielectric 106. The HVNMOS transistor 172 has a dielectric stack composed of high-k dielectric 150 and a sacrificial dielectric 108 on the embodiment high quality gate dielectric 106. The NMOS metal replacement gate material 164 that is deposited on the high-k dielectric 150 sets the work function (turn on voltage) of the low voltage 170 and high voltage 172 NMOS transistors. Source and drain extensions 116 connect the transistor channel under the replacement gates to the deep source and drain diffusions 122. The dopants that form the deep source and drain diffusions are implanted self-aligned to sidewalls 120 on the low voltage 170 and high voltage 172 NMOS transistors.

The low voltage PMOS transistor 176 has high-k dielectric 150 deposited on the embodiment high quality gate dielectric 106. The HVPMOS transistor 174 has a dielectric stack composed of high-k dielectric 150 and sacrificial dielectric 108 on the embodiment high quality gate dielectric 106. PMOS metal replacement gate material 154 deposited on the high-k dielectric 150 sets the work function (turn on voltage) of the low voltage 176 and high voltage 174 PMOS transistors. Source and drain extensions 118 connect the channels of the PMOS transistors 174 and 176 to the deep source and drain diffusions. The p-type dopants of the PMOS deep source and drain diffusions 124 are implanted self-aligned to sidewalls 120 on the low voltage 176 and high voltage 174 PMOS transistors.

A premetal dielectric (PMD) 178 is deposited over the NMOS and PMOS replacement gate transistors, 170, 172, 174, and 176 and on the dielectric 126. Contact plugs 180 are formed through the PMD 178 and dielectric 126 layers to electrically connect the deep source and drain diffusions 122 and 124, the p-type substrate contact diffusion 125, the nwell contact diffusion 123, and the transistor gates to a first level of interconnect 182. Additional dielectric layers and interconnect layers may be formed above the first level of interconnect 182 to complete the integrated circuit.

The major steps in a process flow illustrating a method of forming the embodiment high quality interfacial dielectric 106 on the low voltage (core) transistors and high voltage (input/output=I/O) transistors in a CMOS integrated are depicted in FIGS. 2A through 2K.

Figure 2A:
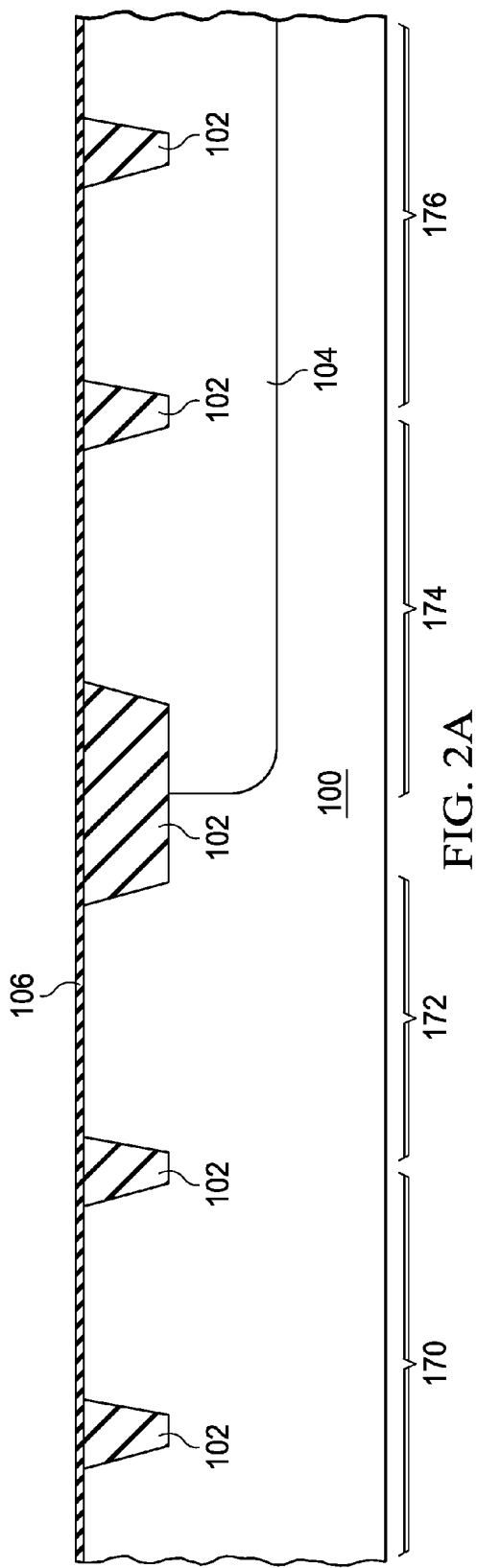
FIGS. 2A-2K are illustrations of steps in the fabrication of integrated circuits formed according to principles of the invention.

FIG. 2A is a cross section of a partially processed CMOS integrated circuit with a p-type substrate 100, an nwell 104 formed in the p-type substrate 100 and shallow trench isolation (STI) 102 structures which electrically isolate transistors from each other and from other devices.

After well formation 104 and after dopants are implanted to set the transistor turn on voltages (Vts), a high quality gate dielectric 106 is formed on the surface of the integrated circuit. This high quality gate dielectric 106 which may be silicon dioxide grown at a temperature greater than about 850° C. Remote plasma nitridation may be used to raise the dielectric constant and also to increase the selectivity of the high quality gate dielectric 106 to subsequent etches. The high quality gate dielectric 106 may be grown using insitu steam oxidation (ISSG) to grow silicon dioxide to a thickness in the range of 0.5 to 1.5 nm. Decoupled plasma nitridation (DPN) may be used to convert the surface of the high quality gate dielectric 106 to silicon oxynitride Typically oxynitride gate dielectric has a nitrogen content in the range of 10 to 20 atomic percent.

Figure 2B:
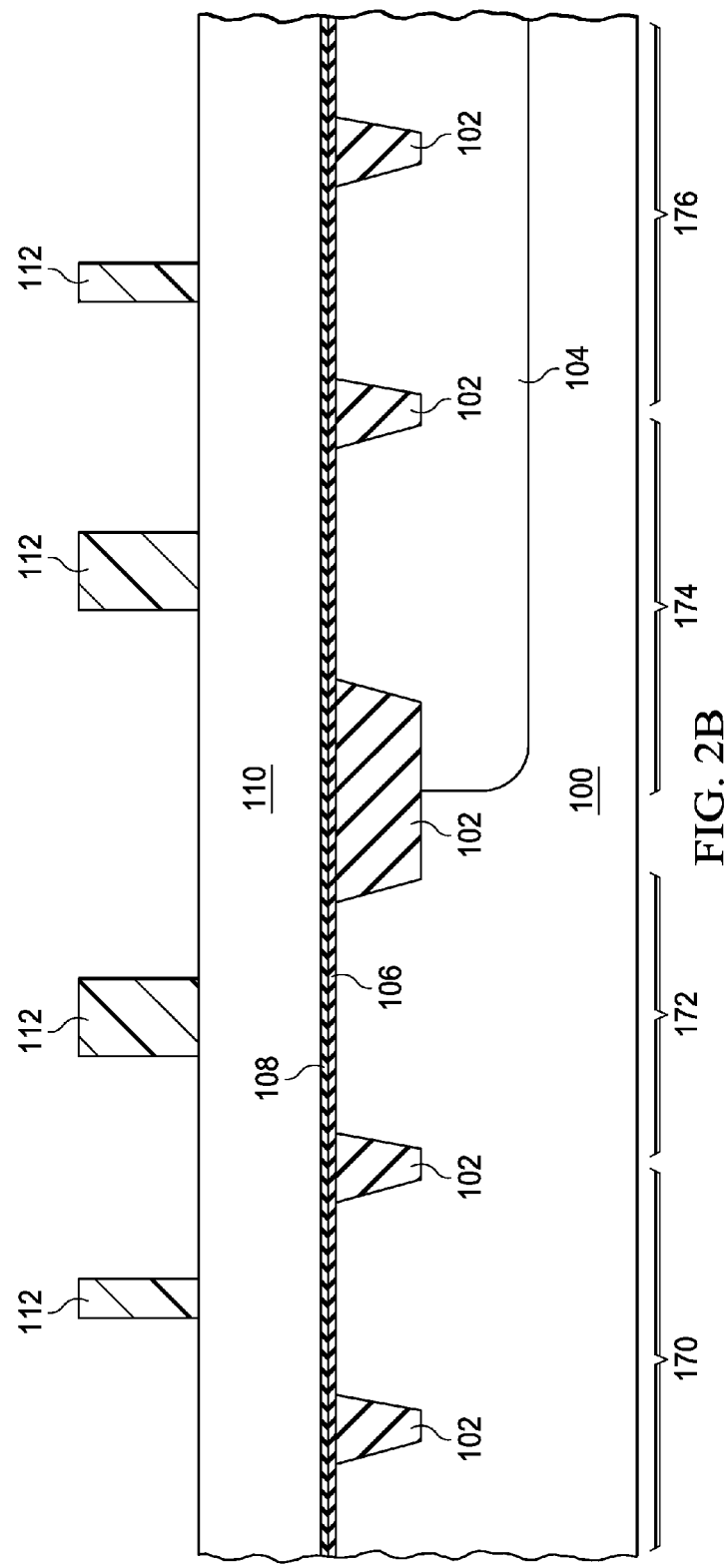

As shown in FIG. 2B a sacrificial dielectric layer 108 is deposited on the high quality gate dielectric 106. Polysilicon or silicon-germanium (SiGe) 110 gate material with a thickness in the range of about 30 to 80 nm is then deposited on the sacrificial dielectric layer 108. A polysilicon replacement gate photo resist pattern 112 is formed on the gate material 110. After the sacrificial dielectric layer 108 is deposited an optional high temperature anneal may be performed to densify the deposited sacrificial dielectric layer 108 to improve its dielectric properties. This may be preferred when the sacrificial dielectric 108 remains in some regions on the wafer. For example the sacrificial dielectric may form part of the gate dielectric stack for the high voltage CMOS transistors. The sacrificial dielectric layer 108 may be a silicon dioxide layer with a thickness in the range of about 2.5 to 3.5 nm. The silicon dioxide may be deposited using atomic layer deposition (ALD). Alternatively, the sacrificial dielectric layer 108 may be a high-k dielectric such as $HfO_x$ or $HfSiO_x$ with a thickness between about 1 and 5 nm. The $HfO_x$ or $HfSiO_x$ may also be deposited using ALD. In an embodiment transistor $HfO_x$ with a thickness of about 4 nm is deposited.

Figure 2C:
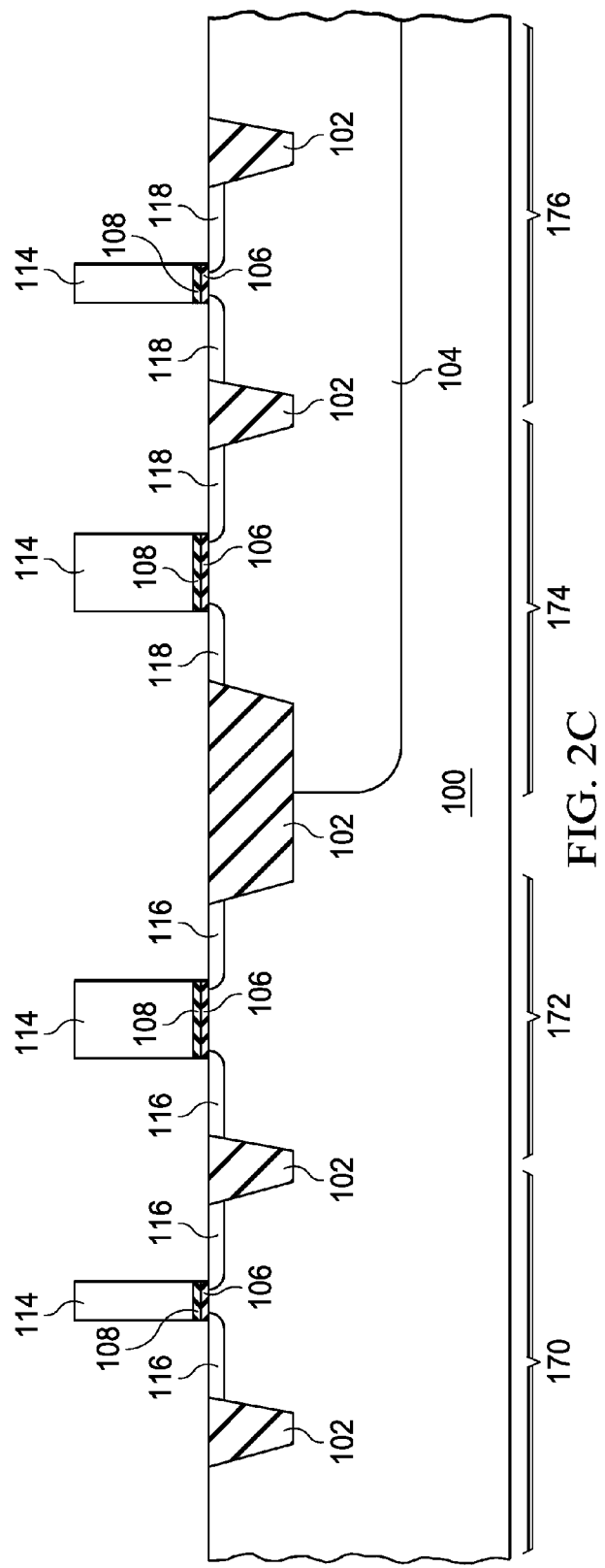

Referring now to FIG. 2C, the polysilicon replacement gates 114 are etched and the gate photo resist pattern 112 removed. An NMOS source and drain extension photo resist pattern and implantation is used to form n-type source and drain extensions 116 on the NMOS low voltage 170 and NMOS high voltage 172 transistors. A PMOS source and drain extension photo resist pattern and implantation is used to form p-type source and drain extensions 118 on the PMOS low voltage 176 and PMOS high voltage 174 transistors.

Figure 2D:
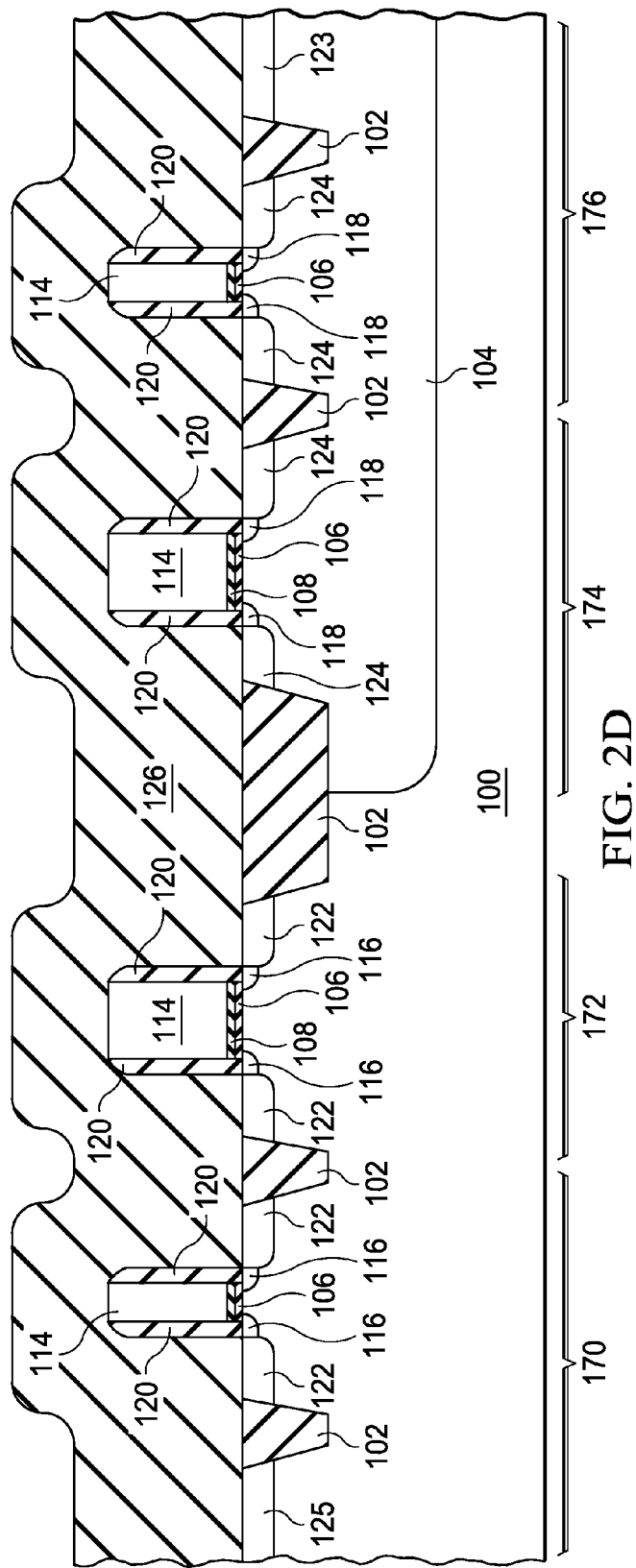

As is illustrated in FIG. 2D after formation of dielectric transistor sidewalls 120, deep NMOS source and drain (NSD) diffusions 122 are formed self aligned to the dielectric sidewalls 120 using an NSD pattern and n-type dopant implantation. Deep PMOS source and drain (PSD) diffusions 124 are formed self aligned to the dielectric sidewalls 120 using a PSD pattern and p-type dopant implantation. A replacement gate dielectric layer 126 is then deposited over the gates. The thickness of the replacement gate dielectric layer 126 is at least equal to the height of the polysilicon replacement gates 114.

Figure 2E:
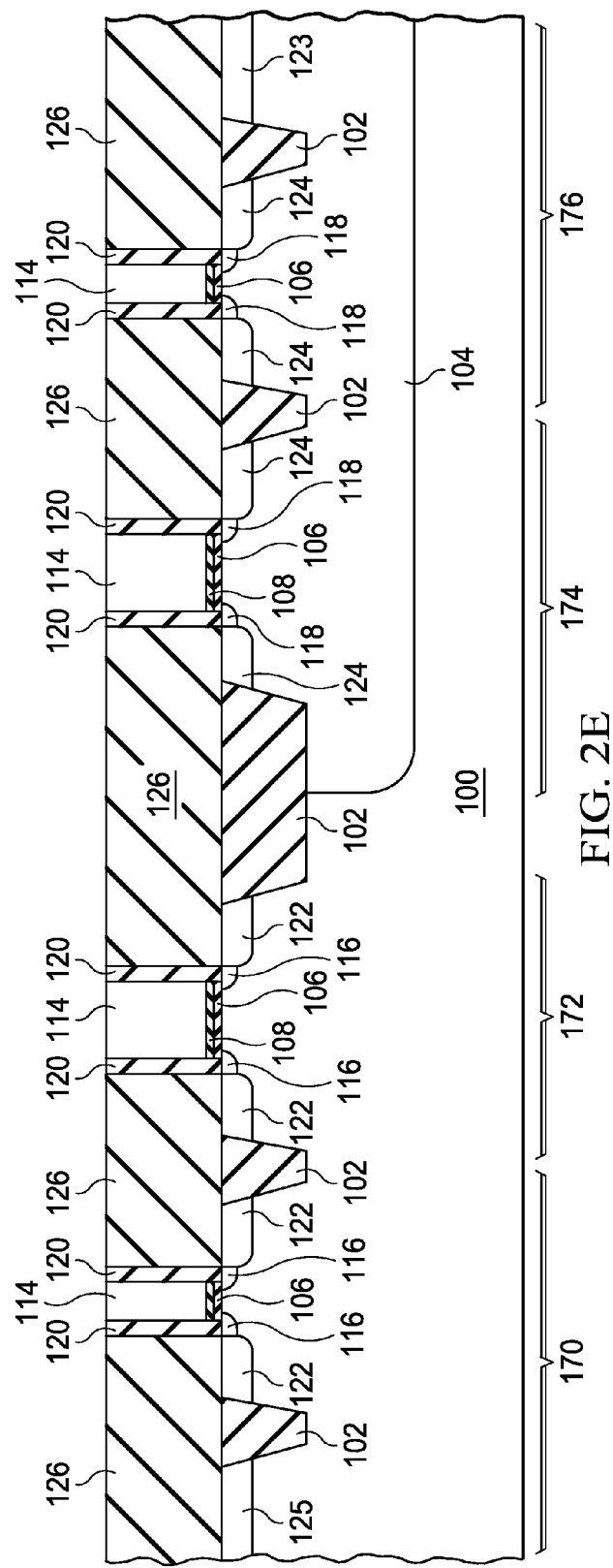

Referring now to FIG. 2E, chemical mechanical polish (CMP) is used to planarize the replacement gate dielectric 126 and to expose the tops of the polysilicon replacement gates 114.

Figure 2F:
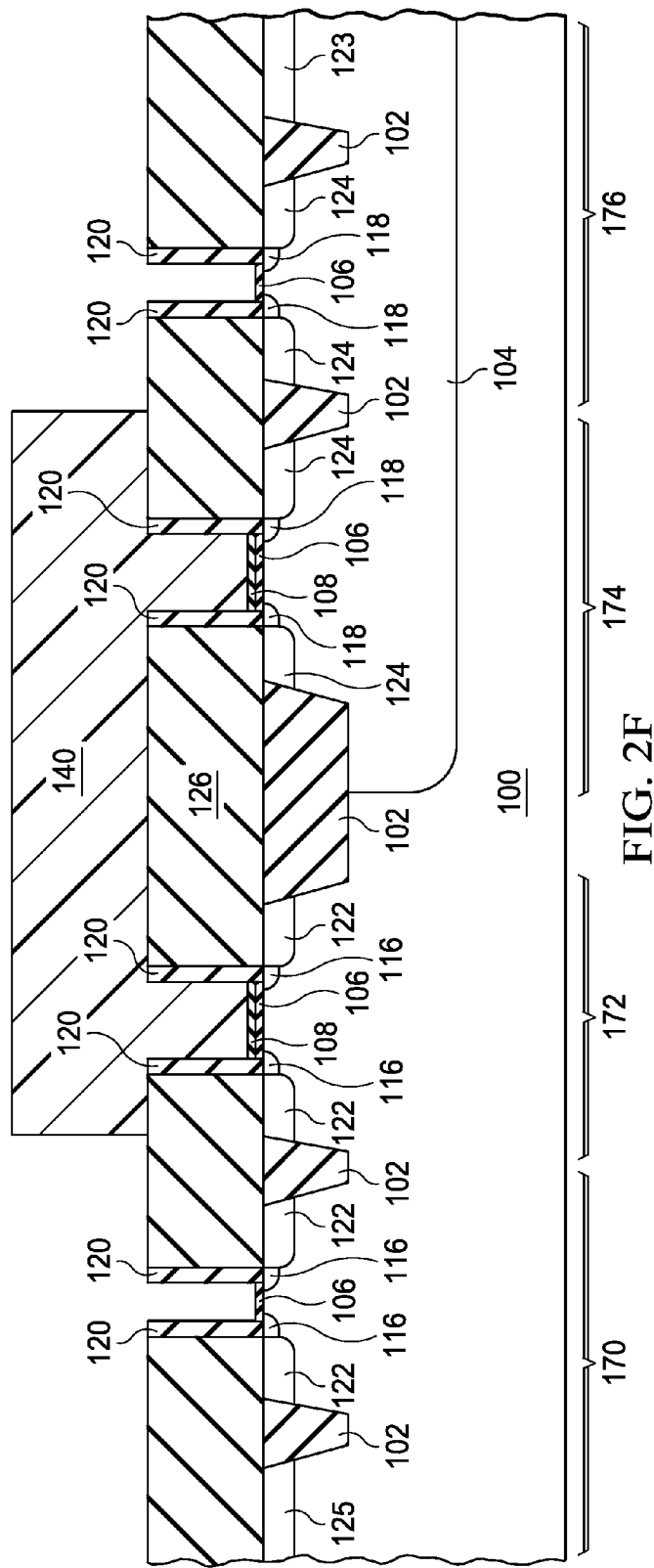

As shown in FIG. 2F, the polysilicon replacement gates are removed and a high voltage photo resist pattern 140 is formed on the integrated circuit to prevent the sacrificial gate dielectric 108 from being removed from the high voltage transistors, 172 and 174. An etch with high selectivity to the high quality gate dielectric 106 is used to remove the sacrificial gate dielectric 108 from the low voltage transistors, 170 and 176. An etch with high selectivity is used to protect the high quality gate dielectric 106 from damage. When the sacrificial gate dielectric 108 is silicon dioxide a water plus HF solution with a dilution ratio $H_2O:HF$ of 100:1 or more may be used to remove the sacrificial gate dielectric 108 from the high quality gate dielectric layer 106. In an example embodiment, a 100:1 solution of $H_2O:HF$ is used to remove sacrificial silicon dioxide gate dielectric 108.

When the sacrificial gate dielectric 108 is a high-k dielectric such as $HfO_x$ or $HFSiO_x$, a solution of 6:1 $H_2SO_4:H_2O_2$ (SPM) at a temperature of about 90° C. may be used to remove the sacrificial high-k dielectric from the underlying high quality gate dielectric 106 without damage.

Figure 2G:
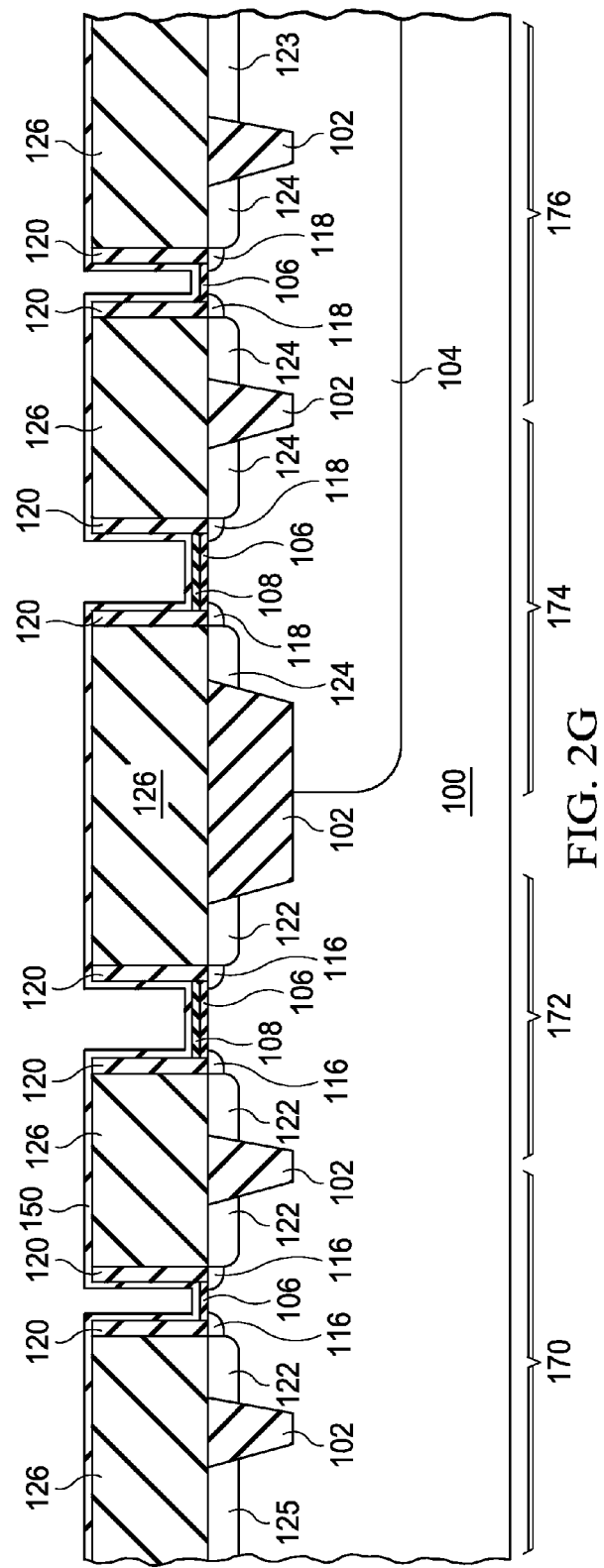

Referring now to FIG. 2G, the high voltage photo resist pattern 140 is removed and high-k dielectric 150 is deposited. The high-k dielectric plus the underlying high quality gate dielectric 106 forms the gate dielectric of the low voltage NMOS 170 and low voltage PMOS 176 transistors. The high-k dielectric 150 plus the sacrificial gate dielectric 180 and the underlying high quality gate dielectric 106 forms the gate dielectric of the high voltage NMOS 172 and high voltage PMOS 174 transistors in this example process flow. The high-k dielectric may be a high-k dielectric such as $HfO_x$, $HfSiO_x$, $HfSiON$, $ZrO_2$, $HfZrO_x$, $AlO_x$, and $TiO_x$ in the range of about 1 to 2 nm thick. In an example embodiment approximately 1.5 nm $HfO_x$ is deposited using ALD.

Figure 2H:
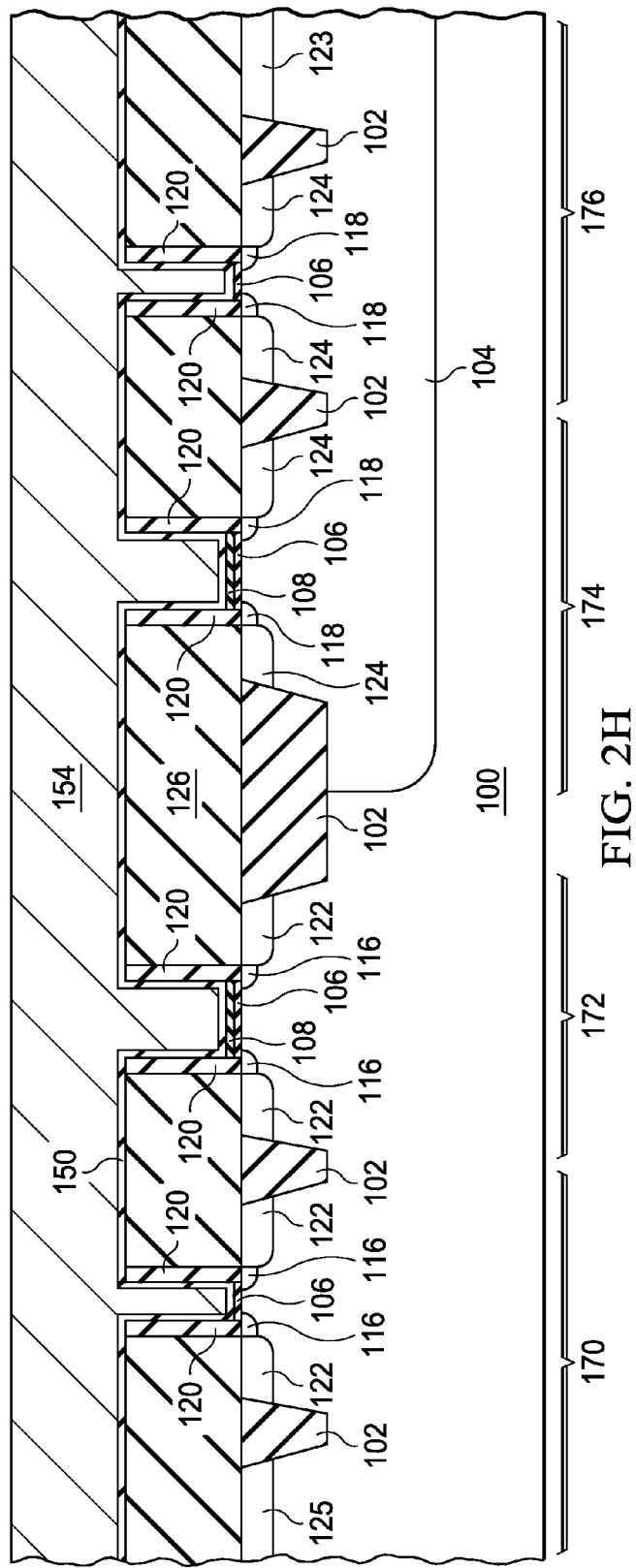

As shown in FIG. 2H, PMOS metal gate material 154 is then deposited into the replacement gate trenches. The PMOS metal gate material 154 may contain for example, one or more metals from the group consisting of titanium nitride, tantalum nitride, aluminum, and platinum. In an example embodiment the PMOS metal gate material 154 is about 8 nm of titanium nitride.

Figure 2I:
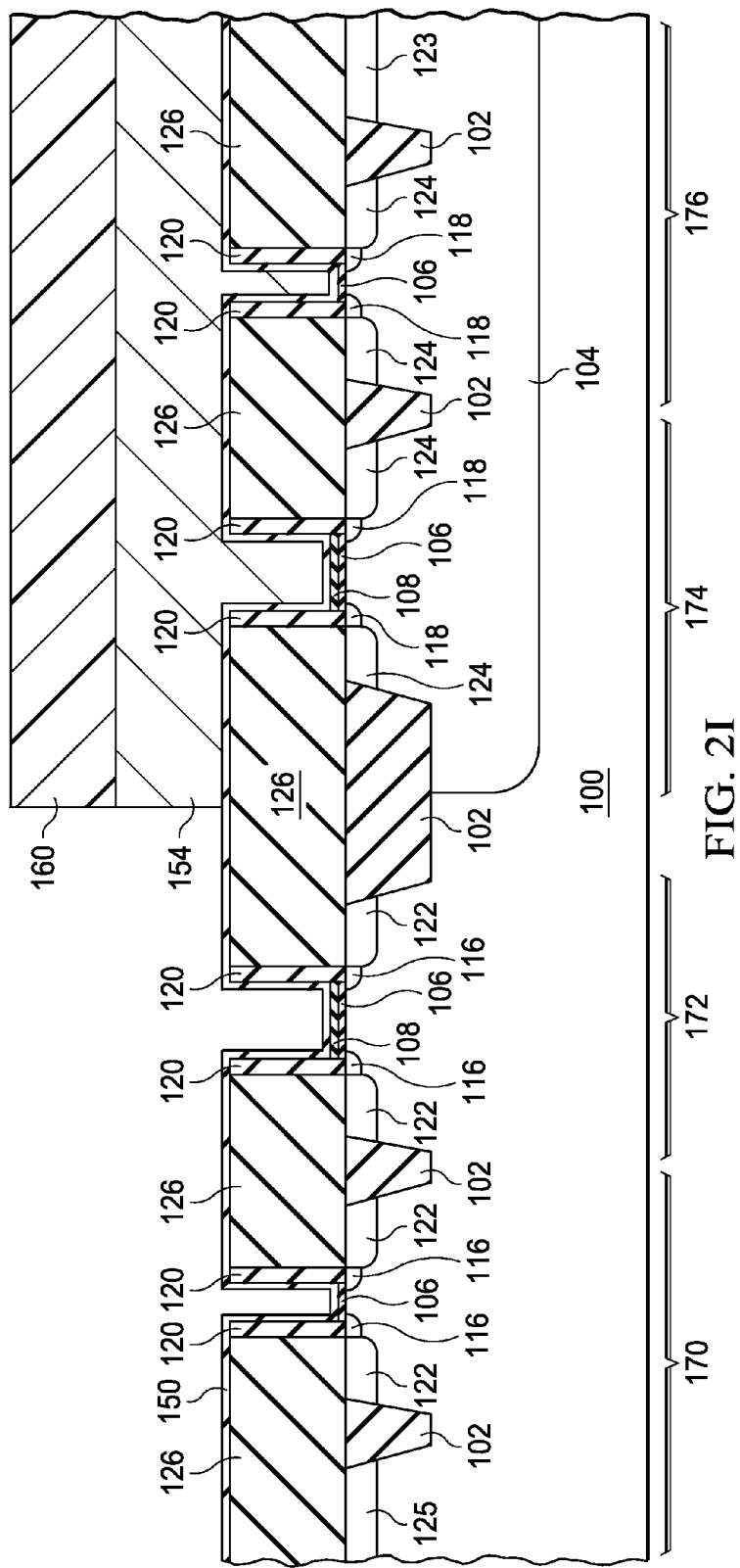

In FIG. 2I PMOS metal gate photo resist pattern 160 is formed on the integrated circuit with an opening over the NMOS transistors 170 and 172 and with a resist geometry 160 over the PMOS transistors 174 and 176 to prevent the PMOS metal gate material 154 from being removed. The PMOS metal gate material 154 is removed from the NMOS transistors, 170 and 172.

Figure 2J:
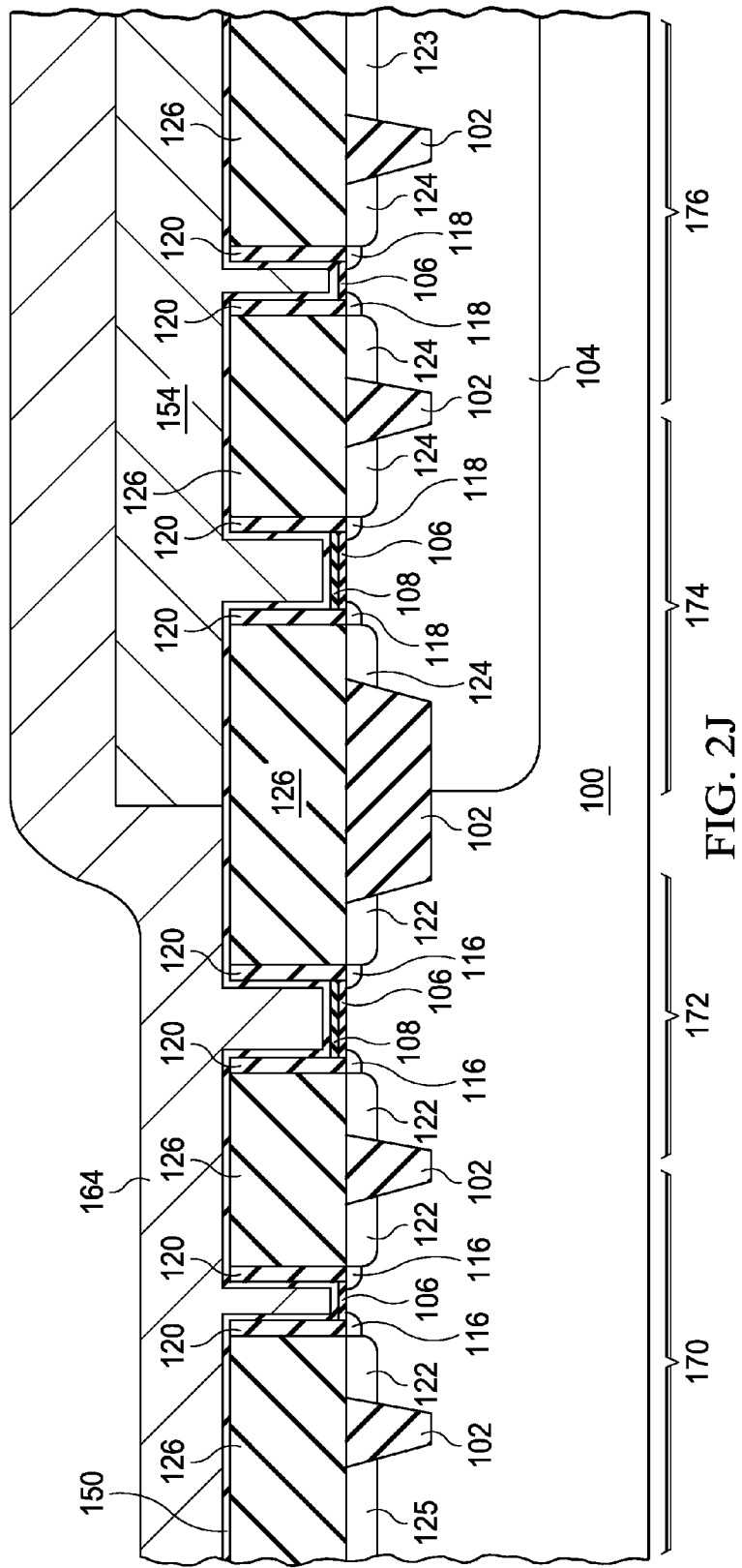

Referring now to FIG. 2J, a NMOS transistor metal gate material 164 is deposited into the NMOS transistor, 170 and 172, replacement gate trenches. The NMOS metal gate material 164 may contain for example, one or more metals from the group consisting of titanium nitride, tantalum nitride, titanium-aluminum alloy, and tungsten. In an example embodiment the NMOS metal gate material 164 is about 3 nm of titanium-aluminum alloy.

Figure 2K:
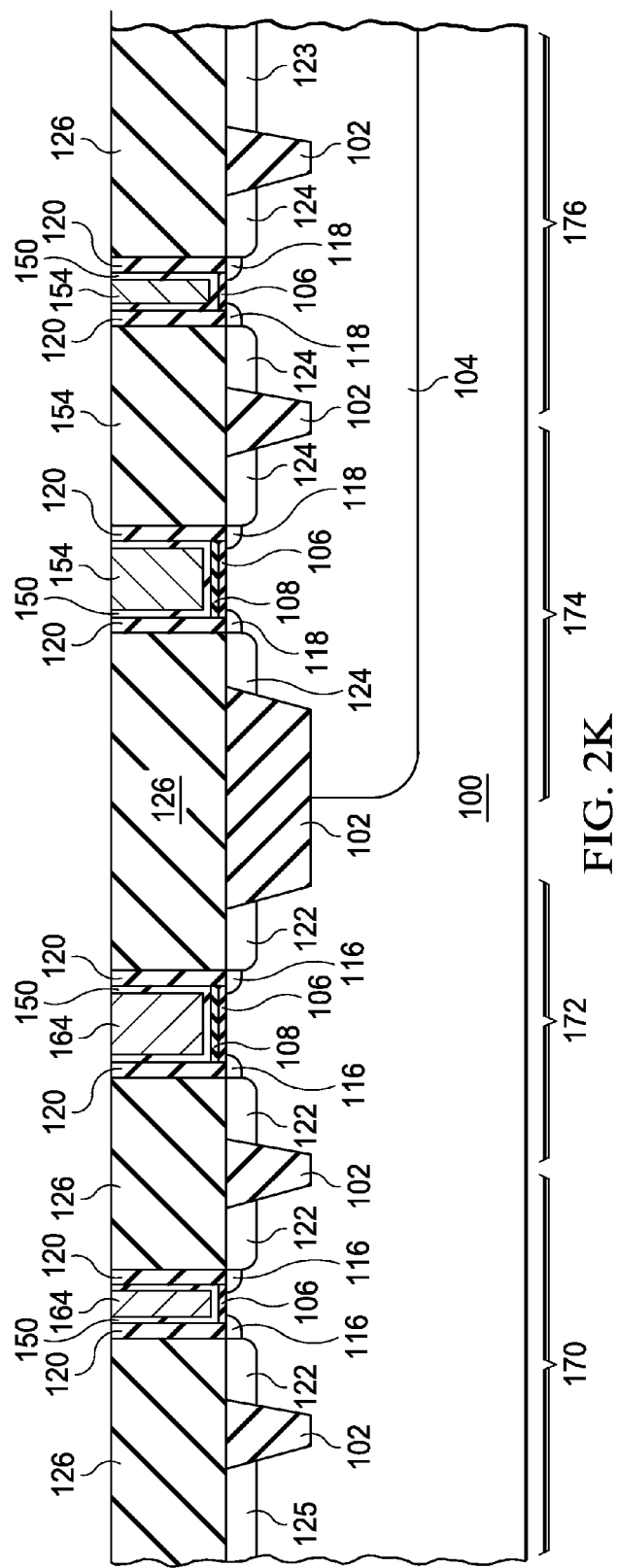

CMP is used to planarize the integrated circuit and to remove the NMOS metal gate material 164 overfill and the PMOS metal gate material 154 overfill from the surface of the replacement gate dielectric layer 126 as shown in FIG. 2K and to form a planar surface on the integrated circuit.

A premetal dielectric layer (PMD) 178 may be added and contact plugs 180 formed to affect electrical connection between the deep source and drain diffusions, 112 and 122, and the first layer of interconnect 182 to form the integrated circuit illustrated in FIG. 1. Additional layers of dielectric and interconnect electrically connected by vias may be formed over the first layer of interconnect 182 to complete the integrated circuit.

Those skilled in the art to which this invention relates will appreciate that many other embodiments and variations are possible within the scope of the claimed invention.

What is claimed is:

1. A process of forming an integrated circuit, comprising the steps:
   forming a high quality gate dielectric on a substrate at a temperature of at least 850° C.;
   depositing a sacrificial gate dielectric on the high quality gate dielectric;
   forming a first polysilicon replacement gate transistor with a first polysilicon replacement gate on the sacrificial gate dielectric;
   removing by etching the first polysilicon replacement gate to form a first replacement gate transistor trench;
   removing the sacrificial gate dielectric from a bottom of the first replacement gate trench using an etch with high selectivity to the high quality gate dielectric;
   depositing a high-k dielectric into the first replacement gate transistor trench wherein the high-k dielectric covers the high quality gate dielectric in the bottom and wherein the high-k dielectric covers vertical sidewalls of the first replacement gate trench;
   depositing metal gate material on the high-k dielectric;
   polishing the integrated circuit to remove overfill of the metal gate material and the high-k dielectric from the flat surface of the replacement gate dielectric;
   forming a second polysilcon replacement gate transistor with a second polysilcon replacement gate wherein the first polysilcon replacement gate transistor is a low voltage transistor and wherein the second polysilicon replacement gate transistor is a high voltage transistor;
   during the step of removing by etching the first polysilicon replacement gate to form the first replacement gate transistor trench, removing by etching the second polysilicon replacement gate to form a second replacement gate transistor trench;
   forming a high voltage transistor photo resist pattern wherein the high voltage transistor photo resist pattern covers the second replacement gate trench and does not cover the first replacement gate trench;
   removing the sacrificial gate dielectric from a bottom of the first replacement gate trench by etching; and
   removing the high voltage transistor photo resist pattern prior to the step of depositing the high-k dielectric.

2. The process of claim 1, wherein the second transistor is an NMOS high voltage transistor with a gate dielectric comprised of the high quality nitrided silicon dioxide dielectric with a thickness between 0.5 and 1.5 nm wherein the silicon dioxide is grown at a temperature greater than 850° C. using ISSG, sacrificial dielectric wherein the sacrificial dielectric is $HfO_x$ with a thickness in the range of 2 nm to 5 nm deposited using ALD, and high-k dielectric wherein the high-k dielectric is $HfO_x$ with a thickness in the range of 1 nm to 2 nm deposited using ALD, and wherein the NMOS high voltage transistor gate material is titanium-aluminum alloy with a thickness of about 3 nm deposited using ALD.

3. The process of claim 1, wherein the second transistor is an NMOS high voltage transistor with a gate dielectric comprised of the high quality nitrided silicon dioxide dielectric with a thickness between 0.5 and 1.5 nm wherein the silicon dioxide is grown at a temperature greater than 850° C. using ISSG, a sacrificial dielectric wherein the sacrificial dielectric is silicon dioxide with a thickness between 2.5 and 3.5 nm deposited using ALD, and high-k dielectric wherein the high-k dielectric is $HfO_x$ with a thickness in the range of 1 nm to 2 nm is deposited using ALD, and wherein the NMOS high voltage transistor gate material is titanium-aluminum alloy with a thickness of about 3 nm deposited using ALD.

4. The process of claim 1 wherein the second transistor is a MOS high voltage transistor with a gate dielectric comprised of the high quality nitrided silicon dioxide dielectric with a thickness between 0.5 and 1.5 nm wherein the silicon dioxide is grown at a temperature greater than 850° C. using ISSG, sacrificial dielectric wherein the sacrificial dielectric is $HfO_x$ with a thickness in the range of 2 nm to 5 nm deposited using ALD, and high-k dielectric wherein the high-k dielectric is $HfO_x$ with a thickness in the range of 1 nm to 2 nm deposited using ALD, and wherein the PMOS high voltage transistor gate material is titanium nitride with a thickness of about 8 nm deposited using ALD.

5. The process of claim 1 wherein the second transistor is a PMOS high voltage transistor with a gate dielectric comprised of the high quality nitrided silicon dioxide dielectric with a thickness between 0.5 and 1.5 nm wherein the silicon dioxide is grown at a temperature greater than 850° C. using ISSG, a sacrificial dielectric wherein the sacrificial dielectric is silicon dioxide with a thickness between 2.5 and 3.5 nm deposited using ALD, and high-k dielectric wherein the high-k dielectric is $HfO_x$ with a thickness in the range of 1 nm to 2 nm is deposited using ALD, and wherein the PMOS high voltage transistor gate material is titanium nitride with a thickness of about 8 nm deposited using ALD.

6. A process of forming an integrated circuit, comprising the steps: forming a high quality gate dielectric on a substrate at a temperature of at least 850° C.; depositing a sacrificial gate dielectric on the high quality gate dielectric; forming a low voltage NMOS and a low voltage PMOS polysilicon replacement gate transistor with polysilicon replacement gates on the sacrificial gate dielectric; forming a high voltage NMOS and a high voltage PMOS polysilicon replacement gate transistor with polysilicon replacement gates on the sacrificial gate dielectric; removing the polysilicon replacement gates from the low voltage NMOS and the low voltage PMOS polysilicon replacement gate transistors and thereby forming a low voltage NMOS and a low voltage PMOS replacement gate transistor trench; removing the sacrificial gate dielectric from the bottoms of the low voltage NMOS and the low voltage PMOS replacement gate transistor trenches; removing the polysilicon replacement gates from the high voltage NMOS and the high voltage PMOS polysilicon replacement gate transistors to form a high voltage NMOS and a high voltage PMOS replacement gate transistor trench; depositing a high-k dielectric onto the high quality gate dielectric in the low voltage NMOS and the low voltage PMOS replacement gate transistor trenches, and depositing the high-k dielectric onto the sacrificial gate dielectric in the high voltage NMOS and the high voltage PMOS replacement gate transistor trenches; depositing PMOS transistor metal gate material onto the high-k dielectric; removing the PMOS transistor metal gate material from the low voltage NMOS and the high voltage NMOS replacement gate transistor trenches; depositing an NMOS transistor metal gate material into the low voltage NMOS and the high voltage NMOS replacement gate transistor trenches and onto the PMOS transistor metal gate material; and removing overfill of NMOS transistor metal gate material to form a low voltage NMOS and a high voltage NMOS metal gate transistor and removing overfill of PMOS transistor metal gate material to form a low voltage PMOS and a high voltage PMOS metal gate transistor.

7. The process of claim 6, wherein
the high quality gate dielectric is high quality nitrided silicon dioxide dielectric with a thickness between 0.5 and 1.5 nm wherein the silicon dioxide is grown at a temperature greater than 850° C. using ISSG
the sacrificial dielectric is $HfO_x$ with a thickness in the range of 2 nm to 5 nm deposited using ALD; and
the high-k dielectric is $HfO_x$ with a thickness in the range of 1 nm to 2 nm deposited using ALD.

8. The process of claim 6, wherein
the NMOS metal gate material is selected from the group consisting of titanium nitride, tantalum nitride, titanium-aluminum alloy, and tungsten and
the PMOS metal gate material is selected from the group consisting of titanium nitride, tantalum nitride, aluminum, and platinum.

9. The process of claim 6, wherein
the low voltage NMOS metal gate transistor is comprised of a titanium-aluminum metal gate with a thickness between 2 nm to 5 nm deposited on a gate dielectric stack comprised of $HfO_x$ with a thickness between 1 nm to 2 nm deposited on high quality nitride silicon dioxide with a thickness between 0.5 and 1.5 nm;
the low voltage PMOS metal gate transistor is comprised of a titanium nitride metal gate with a thickness between 5 nm to 10 nm deposited on a gate dielectric stack comprised of $HfO_x$ with a thickness between 1 nm to 2 nm deposited on high quality nitride silicon dioxide with a thickness between 0.5 and 1.5 nm;
the high voltage NMOS metal gate transistor is comprised of a titanium-aluminum metal gate with a thickness between 2 nm to 5 nm which is deposited on a gate dielectric stack comprised of $HfO_x$ with a thickness between 2 nm to 5 nm which is deposited on $HfO_x$ with a thickness between 1 nm to 2 nm which is deposited on $_{high}$ quality nitride silicon dioxide with a thickness between 0.5 and 1.5 nm;
the high voltage PMOS metal gate transistor is comprised of a titanium nitride metal gate with a thickness between 5 nm to 10 nm deposited on a gate dielectric stack comprised of $HfO_x$ with a thickness between 2 nm to 5 nm which is deposited on $HfO_x$ with a thickness between 1 nm to 2 nm which is deposited on high quality nitride silicon dioxide with a thickness between 0.5 and 1.5 nm.

10. The process of claim 6, wherein
the low voltage NMOS metal gate transistor is comprised of a titanium-aluminum metal gate with a thickness of 3 nm deposited on a gate dielectric stack comprised of $HfO_x$ with a thickness of 1.2 nm deposited on high quality nitride silicon dioxide with a thickness of 1 nm;
the low voltage PMOS metal gate transistor is comprised of a titanium nitride metal gate with a thickness of 8 nm deposited on a gate dielectric stack comprised of $HfO_x$ with a thickness of 1.2 nm deposited on high quality nitride silicon dioxide with a thickness of 1 nm;
the high voltage NMOS metal gate transistor is comprised of a titanium-aluminum metal gate with a thickness of 3 nm which is deposited on a gate dielectric stack comprised of $HfO_x$ with a thickness of 3 nm which is deposited on $HfO_x$ with a thickness of 1.2 nm which is deposited on $_{high}$ quality nitride silicon dioxide with a thickness of 1 nm;
the high voltage PMOS metal gate transistor is comprised of a titanium nitride metal gate with a thickness of 8 nm deposited on a gate dielectric stack comprised of $HfO_x$ with a of 3 nm which is deposited on $HfO_x$ with a thickness of 1.2 nm which is deposited on high quality nitride silicon dioxide with a thickness of 1 nm.

* * * * *